(12) United States Patent
Wu (10) Patent No.: US 6,940,430 B1
(45) Date of Patent: Sep. 6, 2005

(54) SEPARATION ENHANCED GRAY CODES

(75) Inventor: Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/031,632

(22) Filed: Jan. 6, 2005

Related U.S. Application Data (62) Division of application No. 10/752,152, filed on Jan. 6, 2004.
(60) Provisional application No. 60/444,058, filed on Jan. 31, 2003.

(51) Int. Cl.⁷ .............................................. H03M 7/04
(52) U.S. Cl. ............................. 341/98; 341/96; 341/97; 360/48; 360/49; 360/53
(58) Field of Search ............................ 341/96–98, 94; 360/48–49, 53

(56) References Cited

U.S. PATENT DOCUMENTS

| | | | | |
|---|---|---|---|---|
| 4,949,200 A | * | 8/1990 | Weng | 360/72.2 |
| 5,737,142 A | * | 4/1998 | Zook | 360/49 |
| 5,757,567 A | * | 5/1998 | Hetzler et al. | 360/49 |
| 5,852,522 A | | 12/1998 | Lee | |
| 5,982,308 A | | 11/1999 | Bang | |
| 6,005,739 A | * | 12/1999 | Yun | 360/77.04 |
| 6,034,835 A | * | 3/2000 | Serrano | 360/77.05 |
| 6,075,667 A | * | 6/2000 | Kisaka et al. | 360/49 |
| 6,201,652 B1 | | 3/2001 | Rezzi et al. | |
| 6,226,138 B1 | * | 5/2001 | Blaum et al. | 360/48 |
| 6,404,577 B1 | * | 6/2002 | Sobey | 360/49 |
| 6,703,950 B2 | * | 3/2004 | Yi | 341/97 |
| 6,754,019 B2 | * | 6/2004 | Tokizono et al. | 360/53 |
| 6,775,081 B2 | * | 8/2004 | Ottesen et al. | 360/48 |

* cited by examiner

*Primary Examiner*—Michael Tokar
*Assistant Examiner*—Khai Nguyen (57) ABSTRACT

In general, in one aspect, the invention features a Gray code decoder for decoding input numbers according to a K-bit Gray code and a Gray code encoder for encoding input numbers according to the K-bit Gray code. The K-bit Gray code is constructed from a M-bit Gray code having a one-bit separation I and a two-bit separation J and a N-bit Gray code number from a N-bit Gray code, wherein K=M+N, M≧N, and at least one of I and J is greater than, or equal to, $2^N$.

20 Claims, 5 Drawing Sheets

FIG. 1

| index 202 | GC 204 | Bit diff. to 0 206 |
|---|---|---|
| 0 | 00000 | 0 |
| 1 | 00001 | 1 |
| 2 | 00011 | 2 |
| 3 | 00010 | 1 |
| 4 | 00110 | 2 |
| 5 | 00111 | 3 |
| 6 | 00101 | 2 |
| 7 | 00100 | 1 |
| 8 | 01100 | 2 |
| 9 | 01101 | 3 |
| 10 | 01111 | 4 |
| 11 | 01110 | 3 |
| 12 | 01010 | 2 |
| 13 | 01011 | 3 |
| 14 | 01001 | 2 |
| 15 | 01000 | 1 |

Brackets: 208, 210, 212

SEPARATION ENHANCED GRAY CODES

CROSS-REFERENCE TO RELATED APPLICATIONS

This application is a Divisional Application of U.S. Nonprovisional patent application Ser. No. 10/752,152, entitled "Separation Enhanced Gray Codes," filed Jan. 6, 2004, which claims the benefit of U.S. Provisional Patent Application Ser. No. 60/444,058, entitled "Separation Enhanced Gray Code Mapping," filed Jan. 31, 2003, the disclosures thereof incorporated by reference herein in their entirety.

BACKGROUND

The present invention relates generally to Gray codes. More particularly, the present invention relates to a new set of Gray codes having a property that a one or two bit error in reading the code results in a large index shift.

A Gray code is a binary code in which sequential numbers are represented by binary expressions, each of which differs from the preceding expression in one place only (IEEE 100 The Authoritative Dictionary of Standard IEEE Terms, Seventh Edition, The Institute of Electrical and Electronics Engineers, Inc., 3 Park Ave, New York, N.Y., 10016-5997, USA, 2000). Of course, each place in a Gray code number is a bit.

Gray codes are used extensively in determining the angular position of a round object, such as a disk for storing digital data, for example compact discs (CD), digital versatile discs or digital video discs (DVD), hard disks, floppy disks, and so on.

SUMMARY

In general, in one aspect, the invention features a Gray code decoder for decoding input numbers, comprising: a first select circuit to select a M-bit Gray code number from a M-bit Gray code having a one-bit separation I and a two-bit separation J; a second select circuit to select a N-bit Gray code number from a N-bit Gray code, wherein K=M+N, M≧N, and at least one of I and J is greater than, or equal to, $2^N$; a concatenate circuit to concatenate the selected M-bit Gray code number and the selected N-bit Gray code number to produce a K-bit Gray code number; wherein to generate the next $2^N-1$ sequential K-bit Gray code numbers, the first select circuit is further to select a next M-bit Gray code number from the M-bit Gray code, and the concatenate circuit is further to concatenate the selected M-bit Gray code number and the selected N-bit Gray code number to produce a next K-bit Gray code number; and wherein the second select circuit is further to select a next N-bit Gray code number from the N-bit Gray code; and a decoding circuit to decode the input numbers according to the K-bit Gray code numbers.

Particular implementations can include one or more of the following features. The Gray code decoder further comprises: an input circuit to receive the input numbers; and an output circuit to transmit the decoded input numbers. The input circuit comprises a separating circuit to separate each of the input numbers into P parts, where P is greater than one; wherein the decoding circuit comprises P decoding sub-circuits each to decode a respective one of the P parts according to the K-bit Gray code numbers; and wherein the output circuit comprises a combining circuit to combine the P decoded parts produced by the P decoding sub-circuits. The decoding circuit is selected from the group consisting of: a memory; and a logic circuit. A read channel comprises the Gray code decoder.

In general, in one aspect, the invention features a Gray code encoder for encoding input numbers, comprises: a first select circuit to select a M-bit Gray code number from a M-bit Gray code having a one-bit separation I and a two-bit separation J; a second select circuit to select a N-bit Gray code number from a N-bit Gray code, wherein K=M+N, M≧N, and at least one of I and J is greater than, or equal to, $2^N$; a concatenate circuit to concatenate the selected M-bit Gray code number and the selected N-bit Gray code number to produce a K-bit Gray code number; wherein to generate the next $2^N-1$ sequential K-bit Gray code numbers, the first select circuit is further to select a next M-bit Gray code number from the M-bit Gray code, and the concatenate circuit is further to concatenate the selected M-bit Gray code number and the selected N-bit Gray code number to produce a next K-bit Gray code number; and wherein the second select circuit is further to select a next N-bit Gray code number from the N-bit Gray code; and an encoding circuit to encode the input numbers according to the K-bit Gray code numbers.

Particular implementations can include one or more of the following features. The Gray code encoder of claim 6, comprises: an input circuit to receive the input numbers; and an output circuit to transmit the encoded input numbers. The input circuit comprises a separating circuit to separate each of the input numbers into P parts, where P is greater than one; wherein the encoding circuit comprises P encoding sub-circuits each to encode a respective one of the P parts according to the K-bit Gray code numbers; and wherein the output circuit comprises a combining circuit to combine the P encoded parts produced by the P encoding sub-circuits. The encoding circuit is selected from the group consisting of: a memory; and a logic circuit. A write channel comprises the Gray code encoder.

In general, in one aspect, the invention features a Gray code decoder to decode input numbers according to a K-bit Gray code generated by: (a) selecting a M-bit Gray code number from a M-bit Gray code having a one-bit separation I and a two-bit separation J; (b) selecting a N-bit Gray code number from a N-bit Gray code, wherein K=M+N, and M≧N, and at least one of I and J is greater than, or equal to, $2^N$; (c) concatenating the selected M-bit Gray code number and the selected N-bit Gray code number to produce a K-bit Gray code number; (d) generating the next $2^N-1$ sequential K-bit Gray code numbers, comprises (e) selecting a next M-bit Gray code number from the M-bit Gray code, (f) concatenating the selected M-bit Gray code number and the selected N-bit Gray code number to produce a next K-bit Gray code number, and (g) repeating steps (e) and (f); (h) selecting a next N-bit Gray code number from the N-bit Gray code; and (i) repeating steps (c) through (h).

Particular implementations can include one or more of the following features. The Gray code decoder comprises: an input circuit to receive the input numbers; a decoding circuit to decode the input numbers according to the K-bit Gray code; and an output circuit to transmit the decoded input numbers. The input circuit comprises a separating circuit to separate each of the input numbers into P parts, where P is greater than one; wherein the decoding circuit comprises P decoding sub-circuits each to decode a respective one of the P parts according to the K-bit Gray code; and wherein the output circuit comprises a combining circuit to combine the P decoded parts produced by the P decoding sub-circuits. The decoding circuit is selected from the group consisting of: a memory; and a logic circuit. A read channel comprises the Gray code decoder.

In general, in one aspect, the invention features a Gray code encoder to encode input numbers according to a K-bit Gray code generated by: (a) selecting a M-bit Gray code number from a M-bit Gray code having a one-bit separation I and a two-bit separation J; (b) selecting a N-bit Gray code number from a N-bit Gray code, wherein K=M+N, and M≧N, and at least one of I and J is greater than, or equal to, $2^N$; (c) concatenating the selected M-bit Gray code number and the selected N-bit Gray code number to produce a K-bit Gray code number; (d) generating the next $2^N-1$ sequential K-bit Gray code numbers, comprises (e) selecting a next M-bit Gray code number from the M-bit Gray code, (f) concatenating the selected M-bit Gray code number and the selected N-bit Gray code number to produce a next K-bit Gray code number, and (g) repeating steps (e) and (f); (h) selecting a next N-bit Gray code number from the N-bit Gray code; and (i) repeating steps (c) through (h).

Particular implementations can include one or more of the following features. The Gray code encoder comprises: an input circuit to receive the input numbers; a encoding circuit to encode the input numbers according to the K-bit Gray code; and an output circuit to transmit the encoded input numbers. The input circuit comprises a separating circuit to separate each of the input numbers into P parts, where P is greater than one; wherein the encoding circuit comprises P encoding sub-circuits each to encode a respective one of the P parts according to the K-bit Gray code; and wherein the output circuit comprises a combining circuit to combine the P encoded parts produced by the P encoding sub-circuits. The encoding circuit is selected from the group consisting of: a memory; and a logic circuit. A write channel comprises the Gray code encoder.

In general, in one aspect, the invention features a method, apparatus, and computer program for generating a K-bit Gray code, comprising (a) selecting a M-bit Gray code number from a M-bit Gray code having a one-bit separation I and a two-bit separation J; (b) selecting a N-bit Gray code number from a N-bit Gray code, wherein K=M+N, M≧N, and at least one of I and J is greater than, or equal to, $2^N$; (c) concatenating the selected M-bit Gray code number and the selected N-bit Gray code number to produce a K-bit Gray code number; (d) generating the next $2^N-1$ sequential K-bit Gray code numbers, comprising (e) selecting a next M-bit Gray code number from the M-bit Gray code, (f) concatenating the selected M-bit Gray code number and the selected N-bit Gray code number to produce a next K-bit Gray code number, and (g) repeating steps (e) and (f); (h) selecting a next N-bit Gray code number from the N-bit Gray code; and (i) repeating steps (c) through (h).

Particular implementations can include one or more of the following features. The concatenating steps each comprise concatenating the selected M-bit Gray code number and the selected N-bit Gray code number to produce the K-bit Gray code number such that the selected M-bit Gray code number comprises the most-significant bits of the K-bit Gray code number. The concatenating steps each comprise concatenating the selected M-bit Gray code number and the selected N-bit Gray code number to produce the K-bit Gray code number such that the selected M-bit Gray code number comprises the least-significant bits of the K-bit Gray code number. At least one of the M-bit Gray code and the N-bit Gray code is produced by the method. Implementations comprise a Gray code decoder to decode the K-bit Gray code. Implementations comprise a read channel comprising the Gray code decoder. The Gray code decoder comprises an input circuit to receive the one of the K-bit Gray code numbers; a decoding circuit to decode the one of the K-bit Gray code numbers according to the K-bit Gray code; and an output circuit to transmit the decoded K-bit Gray code number. The input circuit comprises a separating circuit to separate the one of the K-bit Gray code numbers into P parts, where P is greater than one; the decoding circuit comprises P decoding sub-circuits each to decode a respective one of the P parts according to the K-bit Gray code; and the output circuit comprises a combining circuit to combine the P decoded parts produced by the P decoding sub-circuits. Each of the decoding sub-circuits is selected from the group consisting of a memory; and a logic circuit. Implementations comprise a read channel comprising the Gray code decoder. Implementations comprise a Gray code encoder to encode the K-bit Gray code. The Gray code encoder comprises an input circuit to receive an input number; a encoding circuit to encode the input number according to the K-bit Gray code; and an output circuit to transmit the encoded K-bit Gray code number. The input circuit comprises a separating circuit to separate the input number into P parts, where P is greater than one; the encoding circuit comprises P encoding sub-circuits each to encode a respective one of the P parts according to the K-bit Gray code; and the output circuit comprises a combining circuit to combine the P encoded parts produced by the P encoding sub-circuits. The encoding circuit is selected from the group consisting of a memory; and a logic circuit. Implementations comprise a write channel comprising the Gray code encoder.

In general, in one aspect, the invention features a 6-bit Gray code having a one-bit separation of $s_1(2)=11$ and a two-bit separation of $s_2(2)=10$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 7-bit Gray code having a one-bit separation of $s_1(2)=13$ and a two-bit separation of $s_2(2)=10$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 8-bit Gray code having a one-bit separation of $s_1(2)=15$ and a two-bit separation of $s_2(2)=14$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 9-bit Gray code having a one-bit separation of $s_1(2)=57$ and a two-bit separation of $s_2(2)=12$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 10-bit Gray code having a one-bit separation of $s_1(2)=19$ and a two-bit separation of $s_2(2)=18$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 11-bit Gray code having a one-bit separation of $s_1(2)=57$ and a two-bit separation of $s_2(2)=18$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 12-bit Gray code having a one-bit separation of $s_1(2)=65$ and a two-bit separation of $s_2(2)=60$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 13-bit Gray code having a one-bit separation of $s_1(2)=77$ and a two-bit separation of $s_2(2)=30$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 14-bit Gray code having a one-bit separation of $s_1(2)=93$ and a two-bit separation of $s_2(2)=80$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 15-bit Gray code having a one-bit separation of $s_1(2)=505$ and a two-bit separation of $s_2(2)=68$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 16-bit Gray code having a one-bit separation of $s_1(2)=385$ and a two-bit separation of $s_2(2)=88$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 17-bit Gray code having a one-bit separation of $s_1(2)=1051$ and a two-bit separation of $s_2(2)=260$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 18-bit Gray code having a one-bit separation of $s_1(2)=577$ and a two-bit separation of $s_2(2)=326$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 19-bit Gray code having a one-bit separation of $s_1(2)=1019$ and a two-bit separation of $s_2(2)=538$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 20-bit Gray code having a one-bit separation of $s_1(2)=3099$ and a two-bit separation of $s_2(2)=522$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 21-bit Gray code having a one-bit separation of $s_1(2)=15921$ and a two-bit separation of $s_2(2)=660$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 22-bit Gray code having a one-bit separation of $s_1(2)=4131$ and a two-bit separation of $s_2(2)=1314$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

In general, in one aspect, the invention features a 23-bit Gray code having a one-bit separation of $s_1(2)=38655$ and a two-bit separation of $s_2(2)=2366$. Implementations comprise a Gray code decoder to decode the Gray code. Implementations comprise a read channel comprising the Gray code decoder. Implementations comprise a Gray code encoder to encode the Gray code. Implementations comprise a write channel comprising the Gray code encoder.

The leading digit(s) of each reference numeral used in this specification indicates the number of the drawing in which the reference numeral first appears.

The details of one or more implementations are set forth in the accompanying drawings and the description below. Other features will be apparent from the description and drawings, and from the claims.

DETAILED DESCRIPTION

Figure 1:
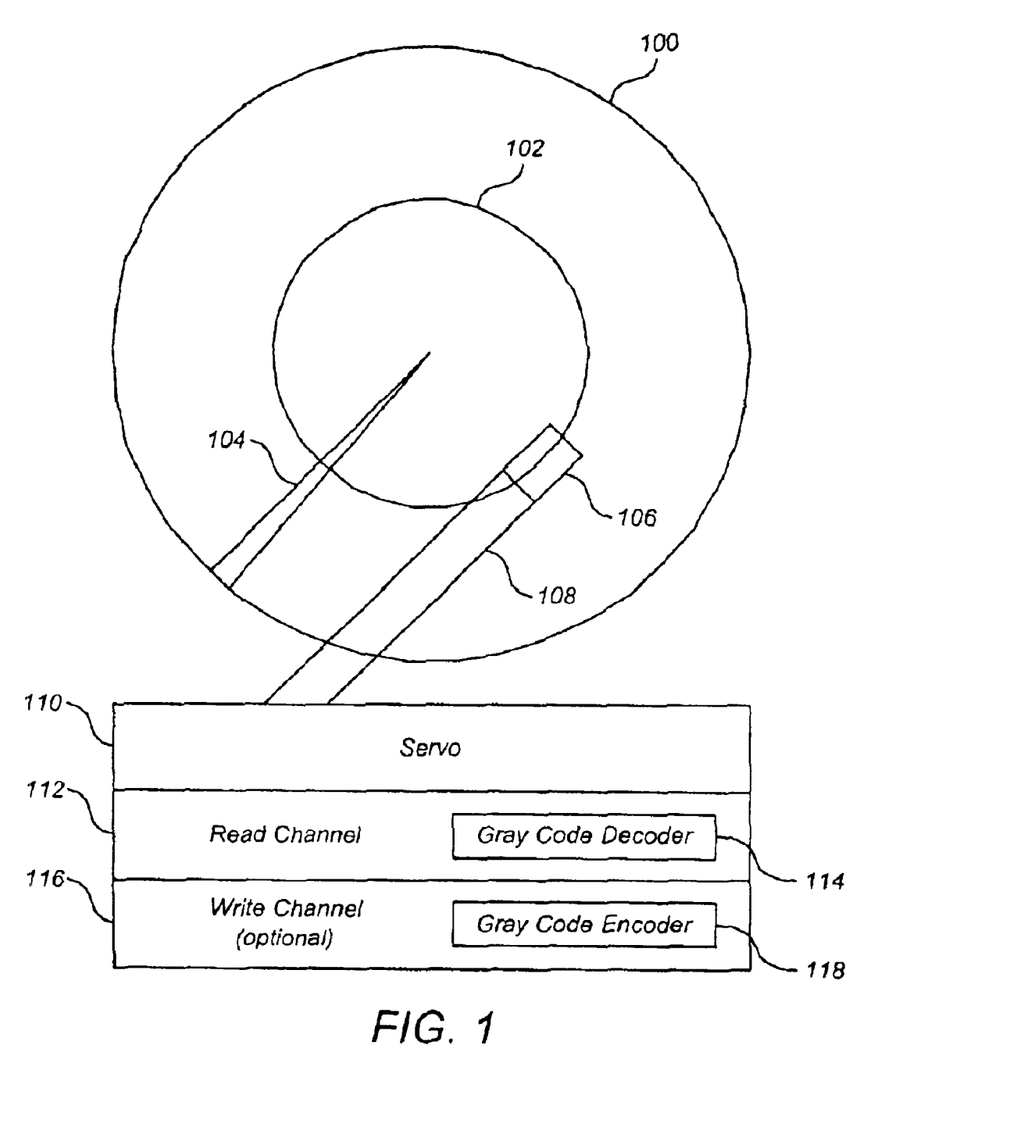
FIG. 1 shows a digital data storage system comprising a digital storage disc according to a preferred embodiment of the present invention.

FIG. 1 shows a digital data storage system comprising a digital storage disc 100 according to a preferred embodiment of the present invention. While embodiments of the present invention are described with reference to disc 100, it will be apparent to one skilled in the relevant arts after reading this description that the present invention applies equally well to other similar types of storage media.

Disc 100 comprises a plurality of concentric circular tracks 102, each adapted to store data, and each having a track number. Tracks 102 are numbered sequentially, for example from the outer edge of disc 100 to its center. The data can be read from tracks 102 by a read channel 112 comprising a Gray code decoder 114 and a read head 106 that is supported by an arm 108 driven by a servo 110. Disc 100 also comprises one or more servo wedges 104 that intersect each track 102. Each servo wedge is numbered with a servo wedge number. The manufacturer of disc 100 writes servo data to each track in the servo wedges, for example using a write channel 116 that comprises a Gray code encoder 118. The servo data usually includes the track number and the servo wedge number.

Servo 110 uses the servo data read by read head 106 to determine the position of read head 106 with respect to disc 100. Of course read head 106 may read the data imperfectly from disc 100 so that the read data comprises one or more errors. In particular, the track number read from a track 102 of disc 100 may differ by one or more bits from the track number of the track 102 over which read head 106 is actually positioned.

If the error results in a track number that is far from the previous position of read head 106, servo 110 will assume the track number was corrupted during the read operation, and will take no action. However, if the error results in a track number that is near the previous position of read head 106, servo 110 assumes that the read head is out of position and takes corrective action. For this reason, it is desirable to encode the servo data using a code that takes advantage of this property. In particular it is desirable to employ a code in which one or two bit errors will result in a number that is far from the true number, so servo 10 will ignore the erroneous data. Such a code is referred to herein as "separation enhanced."

Figure 2:
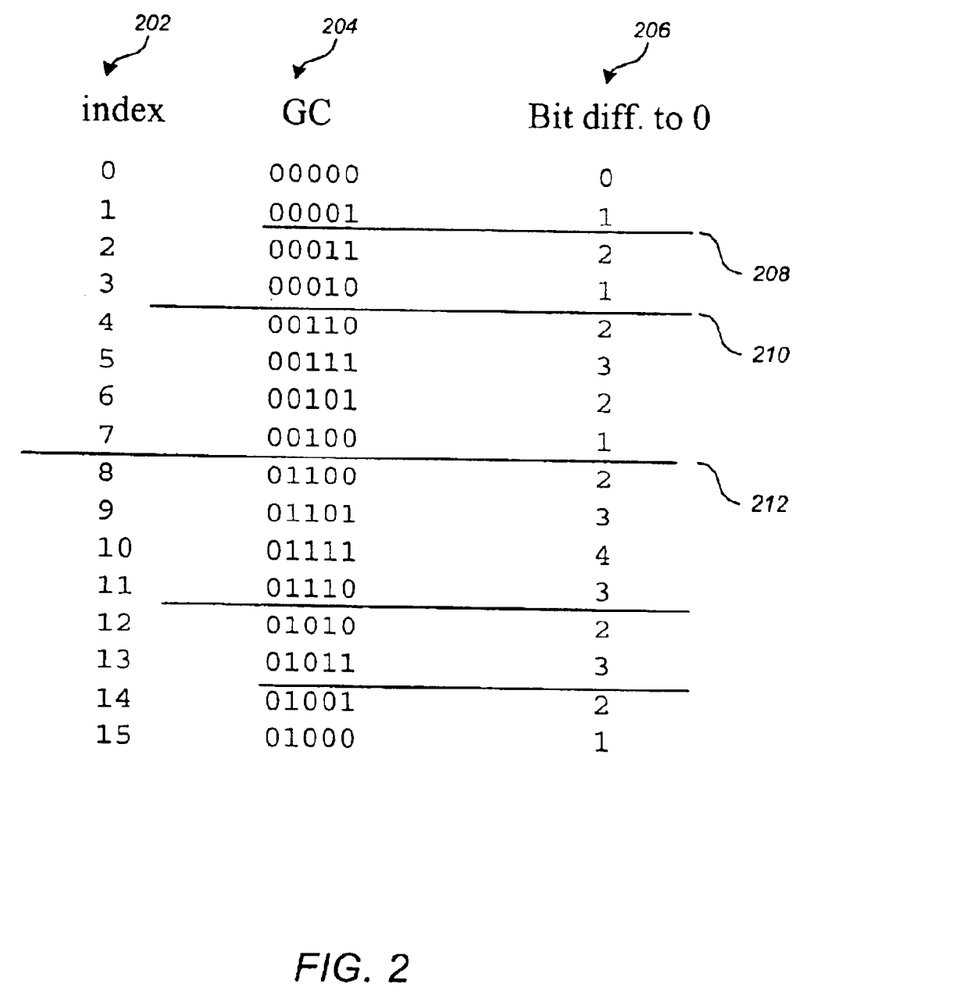
FIG. 2 shows the first sixteen numbers in a 5-bit binary reflected Gray code.

One such code currently in use is the binary reflected Gray code. The first sixteen numbers in a 5-bit binary reflected Gray code are shown in FIG. 2, which lists, for each Gray code number 204, the index 202 and the number of bits 206 that differ between the Gray code number and the Gray code number for an index of zero. The binary reflected Gray code gets its name from its method of construction, which involves reflecting portions of the previous Gray code numbers about an imaginary mirror.

Referring to FIG. 2, the least-significant bits (LSB) of the Gray code numbers for indices 3 and 2 are generated by "reflecting" the Gray code numbers for indices 0 and 1 about mirror 208, so that the LSBs for the Gray code numbers for indices 3 and 2 are the same as the LSBs for the Gray code numbers for indices 0 and 1, respectively. Similarly, the two LSBs for the Gray code numbers for indices 4 through 7 are generated by "reflecting" the Gray code numbers for indices 3 through 0 about mirror 210, so that the two LSBs for the Gray code numbers for indices 4 through 7 are the same as the two LSBs for the Gray code numbers for indices 3 through 0, respectively. And the three LSBs for the Gray code numbers for indices 8 through 15 are generated by "reflecting" the Gray code numbers for indices 7 through 0 about mirror 212, so that the three LSBs for the Gray code numbers for indices 8 through 15 are the same as the three LSBs for the Gray code numbers for indices 7 through 0, respectively.

If there is one bit error at the input of Gray code decoder 114, depending on the position of this one bit error, the output track numbers will be different from the correct track number by a different amount. Let the vector $s_1$ denote the possible track difference, ordered from the smallest to the largest, at the output corresponding to a single bit error at the input. For a conventional binary reflected Gray code, $$s_1 = [1, 3, 7, 15, \ldots 2^j - 1, \ldots] \quad (1)$$

where j is any integer greater than 0.

Similarly, let the vector $s_2$ denote the possible track difference at the output corresponding to two bit errors at the input. For a conventional binary reflected Gray code, $$s_2 = [2, 4, 6, 8, 12, \ldots] \quad (2)$$

By the definition of a Gray code, the first element of si will always be 1, and the first element of $s_2$ will always be 2. However, larger values for the rest of elements in $s_1$ and $s_2$ benefit servo 110 in distinguishing track number errors and head position errors. Therefore, a desirable feature for a Gray code is large values for $s_1(2)$ and $s_2$ (2), which are referred to herein as the "one-bit separation" and "two-bit separation", respectively, of a Gray code. A significant disadvantage of binary reflected Gray codes is that the separation s(k) does not increase with the length of the code.

Embodiments of the present invention employ the Gray codes described below, and include Gray code decoders such as Gray code decoder 114 and read channels such as read channel 112 that decode the Gray code encoded servo data from disk 100 to obtain head position information such as track number and servo wedge number.

Embodiments of the present invention employ Gray codes that can be made from one or more other Gray codes according to the processes described below. One advantage of the separation-enhanced Gray codes of the present invention is that the separation of the codes increases with the length of the code. In fact, the one-bit separation of a Gray code formed according to the present invention by combining two Gray codes is greater than the one-bit separation of either of those Gray codes. Similarly, the two-bit separation is greater than the two-bit separation of either of those Gray codes.

Figure 3:
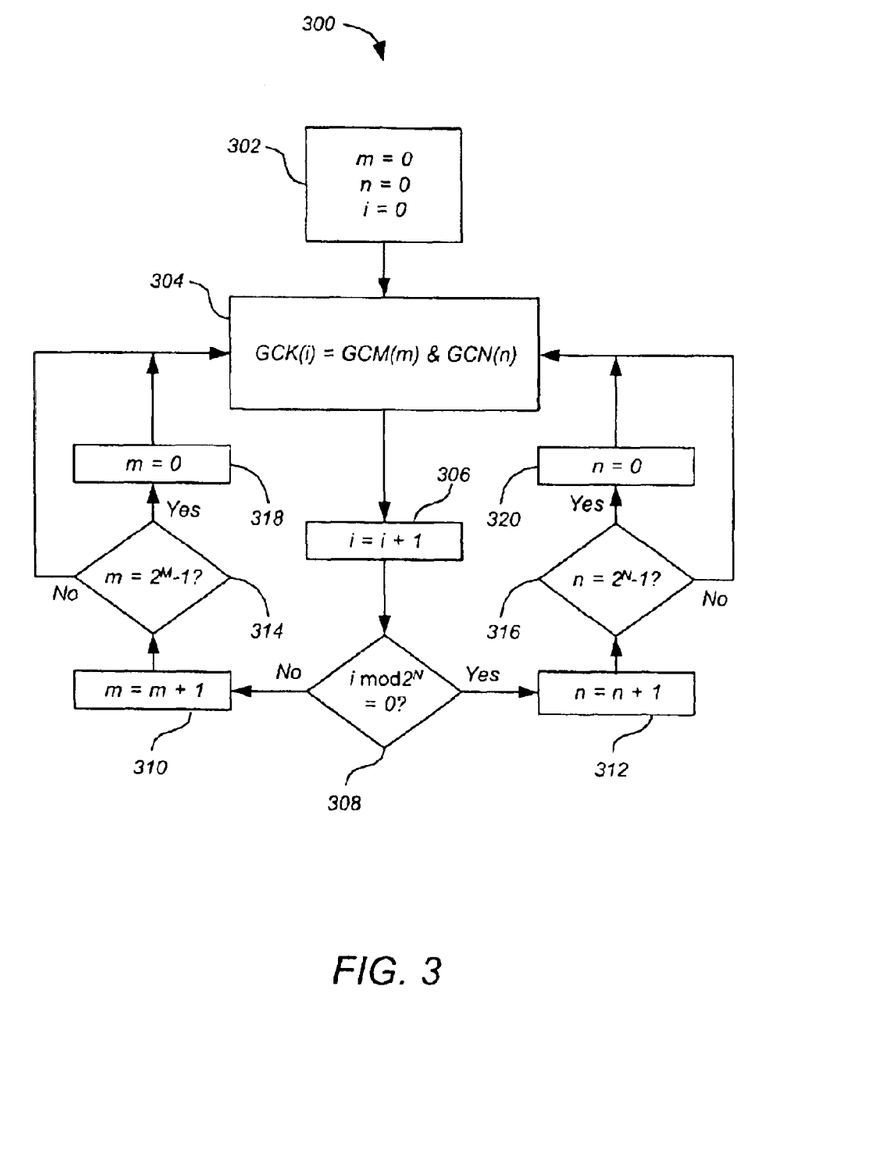
FIG. 3 is a flowchart of a process according to a preferred embodiment.

FIG. 3 is a flowchart of a process 300 according to a preferred embodiment. Process 300 concatenates Gray code numbers from one or more Gray codes in a particular way to produce a Gray code that has several useful and beneficial properties, which are described in detail below. Process 300 can be used with one or more conventional Gray codes, one or more Gray codes according to embodiments of the present invention, or any combination thereof.

Process 300 combines an M-bit Gray code with an N-bit Gray code to generate a K-bit Gray code where K=M+N and M is greater than, or equal to, N. In some embodiments, more than two Gray codes are combined. Of course, it is desirable that the one-bit separation of the resulting K-bit Gray code be greater than the one-bit separation of either of the constituent M-bit and N-bit Gray codes; this is so when the one-bit separation I of the M-bit Gray code is greater than, or equal to, $2^N$. Similarly, it is desirable that the two-bit separation of the resulting K-bit Gray code be greater than the two-bit separation of either of the constituent M-bit and N-bit Gray codes; this is so when the two-bit separation J of the M-bit Gray code is greater than, or equal to, $2^N$. Embodiments of the present invention include Gray codes constructed according to either or both of these restrictions.

Process 300 uses three counters to keep track of the indices of the three codes. Counter m represents the index of the M-bit code. Counter n represents the index of the N-bit code. Counter i represents the index of the K-bit code being generated. Process 300 begins with index values of zero and counts up. Other embodiments start with other index values, and can either count up or count down for each index. Process 300 begins by setting the counters m, n, and i to zero (step 302).

Process 300 then generates the K-bit Gray code number for the index i (shown as GCK(i)) by concatenating the M-bit Gray code number for the index m (shown as GCM (m)) with the N-bit Gray code number for the index n (shown as GCN(n)) (step 304). In some embodiments the M-bit Gray code number comprises the most-significant bits of the K-bit Gray code number. In other embodiments the N-bit Gray code number comprises the most-significant bits of the K-bit Gray code number. Note that the operator "&" is used to represent this concatenation operation.

Process 300 then increments index i (step 306). If i mod $2^N \neq 0$ (step 308), then process 300 increments index m (step 310), thereby selecting the next number in the M-bit Gray code. Then if $m=2^M-1$ (step 314), then process 300 sets index m to zero (step 318) and resumes at step 304. But if at step 314 $m \neq 2^M-1$, process 300 resumes at step 304 without setting index m to zero.

But if at step 308 i mod $2^N=0$, then process 300 increments index n (step 312), thereby selecting the next number in the N-bit Gray code. Then if $n=2^N-1$ (step 316), then process 300 sets index n to zero (step 320) and resumes at step 304. But if at step 316 $n \neq 2^N-1$, process 300 resumes at step 304 without setting index n to zero.

Note that process 300 does not allow indices m and n to increment simultaneously. If they did, then both the M-bit and N-bit Gray codes would advance simultaneously, causing a two-bit difference between adjacent K-bit Gray code numbers, which is not allowed by the definition of Gray codes.

Figure 4:
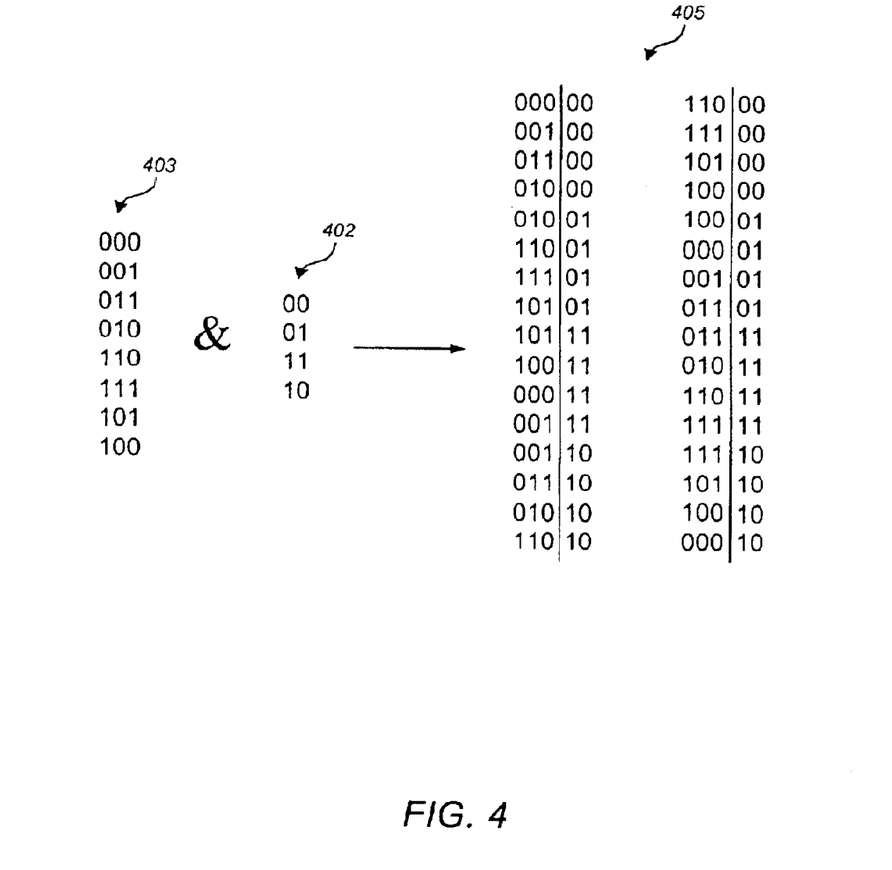
FIG. 4 shows the combination of a 3-bit Gray code with a 2-bit Gray code to form a 5-bit Gray code.

An example is described to illustrate the operation of process 300. FIG. 4 shows the combination of a 3-bit Gray code 403 with a 2-bit Gray code 402 to form a 5-bit Gray code 405. Thus in this example, M=3, N=2, and K=5.

Referring to FIG. 4, it is clear that 5-bit Gray code sequence 405 is the concatenation of 3-bit Gray code sequence 403 with 2-bit Gray code sequence 402, with each of sequences 403 and 402 advancing according to different rules. The two least-significant bits of sequence 405 are sequence 402, but incrementing every $2^n=4$ steps. The three most-significant bits of sequence 405 are sequence 403, incrementing every step with one exception. Because sequence 405 is a Gray code, sequences 402 and 403 cannot increment simultaneously as this would cause a 2-bit change in sequence 405. Therefore, sequence 403 does not increment when sequence 402 increments. For example, starting with sequence 405 number 00000, sequence 403 increments three times to form the next three numbers in sequence 405: 00100, 01100, and 01000. But for the fourth number in sequence 405, because sequence 402 increments to 01, sequence 403 does not increment, but instead remains at 010 to produce sequence 405 number 01001. This process repeats to create sequence 405.

Figure 5:
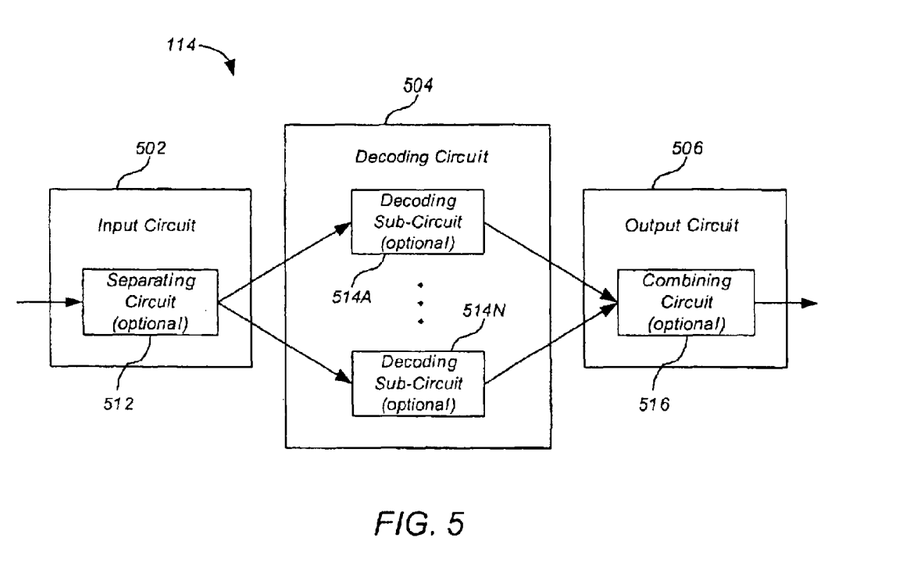
FIG. 5 shows detail of the Gray code decoder of FIG. 1 according to a preferred embodiment.

FIG. 5 shows detail of Gray code decoder 114 according to a preferred embodiment. Gray code decoder 114 comprises an input circuit 502, a decoding circuit 504, and an output circuit 506. Decoding circuit 504 can be implemented as a memory such as a look-up table, as a logic circuit, or the like.

Input circuit 502 receives a Gray code number, for example read from a servo wedge 104 by read channel 112. Decoding circuit 504 decodes the Gray code numbers according to a Gray code, for example to produce a track number. Output circuit 506 transmits the decoded Gray code number.

Preferably the Gray code number is separated into two or more parts before decoding in order to speed the decoding process. The number of parts can be selected based on the length of the Gray code, as would be apparent to one of ordinary skill in the relevant arts. To this end, decoding circuit 504 comprises P decoding sub-circuits 514A through 514P. Input circuit 502 comprises a separating circuit 512 that separates the received Gray code number into P parts, for example by passing a predetermined number of the bits of the Gray code number to each of the decoding sub-circuits 514. Output circuit 506 comprises a combining circuit 516 that combines the outputs of decoding sub-circuits 514 to produce the track number.

Figure 6:
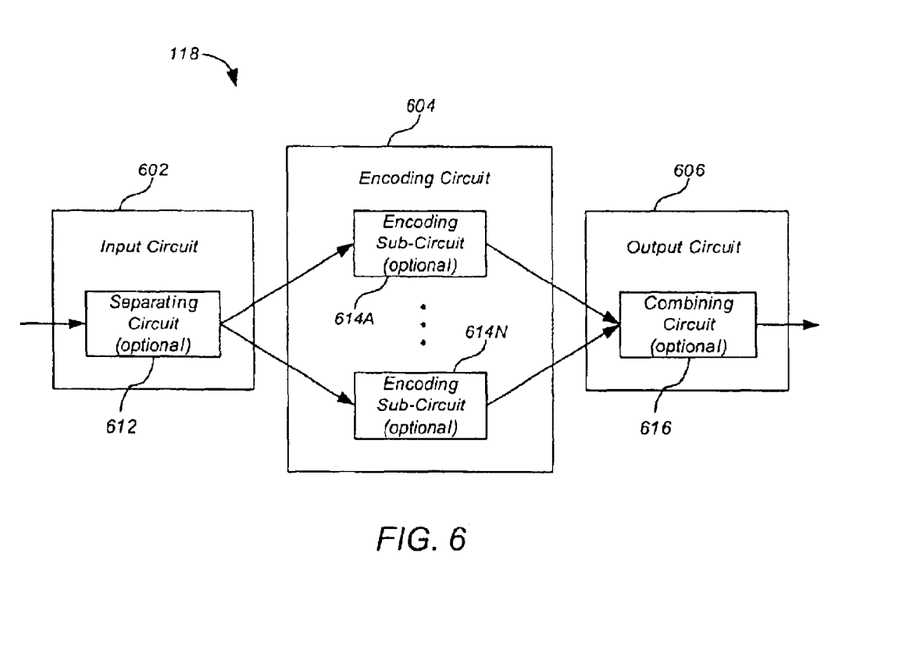
FIG. 6 shows detail of the Gray code encoder of FIG. 1 according to a preferred embodiment.

FIG. 6 shows detail of Gray code encoder 118 according to a preferred embodiment. Gray code encoder 118 comprises an input circuit 602, a encoding circuit 604, and an output circuit 606. Encoding circuit 604 can be implemented as a memory such as a look-up table, as a logic circuit, or the like.

Input circuit 602 receives a number, for example a track number received by write channel 118. Encoding circuit 604 encodes the number according to a Gray code. Output circuit 606 transmits the encoded Gray code number.

Preferably the number is separated into two or more parts before encoding in order to speed the encoding process. The number of parts can be selected based on the length of the Gray code, as would be apparent to one of ordinary skill in the relevant arts. To this end, encoding circuit 604 comprises P encoding sub-circuits 614A through 614P. Input circuit 602 comprises a separating circuit 612 that separates the received number into P parts, for example by passing a predetermined number of the bits of the number to each of the encoding sub-circuits 614. Output circuit 606 comprises a combining circuit 616 that combines the outputs of encoding sub-circuits 614 to produce the Gray code number.

The inventor has also found several separation-enhanced Gray codes using search techniques. The properties of these separation-enhanced Gray codes are presented in Table 1.

TABLE 1

| Length (bits) | One-bit Separation $s_1$ | Two-bit Separation $s_2$ |
|---|---|---|
| 6 | 11 | 10 |
| 7 | 13 | 10 |
| 8 | 15 | 14 |
| 9 | 57 | 12 |
| 10 | 19 | 18 |
| 11 | 57 | 18 |
| 12 | 65 | 60 |
| 13 | 77 | 30 |
| 14 | 93 | 80 |
| 15 | 505 | 68 |
| 16 | 385 | 88 |
| 17 | 1051 | 260 |
| 18 | 577 | 326 |
| 19 | 1019 | 538 |
| 20 | 3099 | 522 |
| 21 | 15291 | 660 |
| 22 | 4131 | 1314 |
| 23 | 38655 | 2366 |

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

What is claimed is:

1. A Gray code decoder for decoding input numbers, comprising:
    a first select circuit to select a M-bit Gray code number from a M-bit Gray code having a one-bit separation I and a two-bit separation J;
    a second select circuit to select a N-bit Gray code number from a N-bit Gray code,
    wherein K=M+N, M≧N, and at least one of I and J is greater than, or equal to, $2^N$;
    a concatenate circuit to concatenate the selected M-bit Gray code number and the selected N-bit Gray code number to produce a K-bit Gray code number;
    wherein to generate the next $2^N-1$ sequential K-bit Gray code numbers,
        the first select circuit is further to select a next M-bit Gray code number from the M-bit Gray code, and
        the concatenate circuit is further to concatenate the selected M-bit Gray code number and the selected N-bit Gray code number to produce a next K-bit Gray code number; and
    wherein the second select circuit is further to select a next N-bit Gray code number from the N-bit Gray code; and
    a decoding circuit to decode the input numbers according to the K-bit Gray code numbers.

2. The Gray code decoder of claim 1, further comprising:
    an input circuit to receive the input numbers; and
    an output circuit to transmit the decoded input numbers.

3. The Gray code decoder of claim 2:
    wherein the input circuit comprises a separating circuit to separate each of the input numbers into P parts, where P is greater than one;
    wherein the decoding circuit comprises P decoding sub-circuits each to decode a respective one of the P parts according to the K-bit Gray code numbers; and
    wherein the output circuit comprises a combining circuit to combine the P decoded parts produced by the P decoding sub-circuits.

4. The Gray code decoder of claim 2, wherein the decoding circuit is selected from the group consisting of:
    a memory; and
    a logic circuit.

5. A read channel comprising the Gray code decoder of claim 1.

6. A Gray code encoder for encoding input numbers, comprising:
    a first select circuit to select a M-bit Gray code number from a M-bit Gray code having a one-bit separation I and a two-bit separation J;
    a second select circuit to select a N-bit Gray code number from a N-bit Gray code,
    wherein K=M+N, M≧N, and at least one of I and J is greater than, or equal to, $2^N$;
    a concatenate circuit to concatenate the selected M-bit Gray code number and the selected N-bit Gray code number to produce a K-bit Gray code number;
    wherein to generate the next $2^N-1$ sequential K-bit Gray code numbers,
        the first select circuit is further to select a next M-bit Gray code number from the M-bit Gray code, and
        the concatenate circuit is further to concatenate the selected M-bit Gray code number and the selected N-bit Gray code number to produce a next K-bit Gray code number; and
    wherein the second select circuit is further to select a next N-bit Gray code number from the N-bit Gray code; and
    an encoding circuit to encode the input numbers according to the K-bit Gray code numbers.

7. The Gray code encoder of claim 6, comprising:
    an input circuit to receive the input numbers; and
    an output circuit to transmit the encoded input numbers.

8. The Gray code encoder of claim 7:
    wherein the input circuit comprises a separating circuit to separate each of the input numbers into P parts, where P is greater than one;
    wherein the encoding circuit comprises P encoding sub-circuits each to encode a respective one of the P parts according to the K-bit Gray code numbers; and
    wherein the output circuit comprises a combining circuit to combine the P encoded parts produced by the P encoding sub-circuits.

9. The Gray code encoder of claim 7, wherein the encoding circuit is selected from the group consisting of:
    a memory; and
    a logic circuit.

10. A write channel comprising the Gray code encoder of claim 6.

11. A Gray code decoder to decode input numbers according to a K-bit Gray code generated by:
    (a) selecting a M-bit Gray code number from a M-bit Gray code having a one-bit separation I and a two-bit separation J;
    (b) selecting a N-bit Gray code number from a N-bit Gray code, wherein K=M+N, M≧N, and at least one of I and J is greater than, or equal to, $2^N$;
    (c) concatenating the selected M-bit Gray code number and the selected N-bit Gray code number to produce a K-bit Gray code number;

(d) generating the next $2^N-1$ sequential K-bit Gray code numbers, comprising
  (e) selecting a next M-bit Gray code number from the M-bit Gray code,
  (f) concatenating the selected M-bit Gray code number and the selected N-bit Gray code number to produce a next K-bit Gray code number, and
  (g) repeating steps (e) and (f);
(h) selecting a next N-bit Gray code number from the N-bit Gray code; and
(i) repeating steps (c) through (h).

12. The Gray code decoder of claim 11, comprising:

an input circuit to receive the input numbers;

a decoding circuit to decode the input numbers according to the K-bit Gray code; and an output circuit to transmit the decoded input numbers.

13. The Gray code decoder of claim 12:

wherein the input circuit comprises a separating circuit to separate each of the input numbers into P parts, where P is greater than one;

wherein the decoding circuit comprises P decoding sub-circuits each to decode a respective one of the P parts according to the K-bit Gray code; and wherein the output circuit comprises a combining circuit to combine the P decoded parts produced by the P decoding sub-circuits.

14. The Gray code decoder of claim 12, wherein the decoding circuit is selected from the group consisting of:

a memory; and a logic circuit.

15. A read channel comprising the Gray code decoder of claim 11.

16. A Gray code encoder to encode input numbers according to a K-bit Gray code generated by:

(a) selecting a M-bit Gray code number from a M-bit Gray code having a one-bit separation I and a two-bit separation J;

(b) selecting a N-bit Gray code number from a N-bit Gray code, wherein K=M+N, M≧N, and at least one of I and J is greater than, or equal to, $2^N$;

(c) concatenating the selected M-bit Gray code number and the selected N-bit Gray code number to produce a K-bit Gray code number;

(d) generating the next $2^N-1$ sequential K-bit Gray code numbers, comprising
  (e) selecting a next M-bit Gray code number from the M-bit Gray code,
  (f) concatenating the selected M-bit Gray code number and the selected N-bit Gray code number to produce a next K-bit Gray code number, and
  (g) repeating steps (e) and (f);
(h) selecting a next N-bit Gray code number from the N-bit Gray code; and
(i) repeating steps (c) through (h).

17. The Gray code encoder of claim 16, comprising:

an input circuit to receive the input numbers;

a encoding circuit to encode the input numbers according to the K-bit Gray code; and an output circuit to transmit the encoded input numbers.

18. The Gray code encoder of claim 17:

wherein the input circuit comprises a separating circuit to separate each of the input numbers into P parts, where P is greater than one;

wherein the encoding circuit comprises P encoding sub-circuits each to encode a respective one of the P parts according to the K-bit Gray code; and wherein the output circuit comprises a combining circuit to combine the P encoded parts produced by the P encoding sub-circuits.

19. The Gray code encoder of claim 17, wherein the encoding circuit is selected from the group consisting of:

a memory; and a logic circuit.

20. A write channel comprising the Gray code encoder of claim 16.

\* \* \* \* \*

UNITED STATES PATENT AND TRADEMARK OFFICE
CERTIFICATE OF CORRECTION

PATENT NO. : 6,940,430 B1 Page 1 of 1
APPLICATION NO. : 11/031632
DATED : September 6, 2005
INVENTOR(S) : Zining Wu It is certified that error appears in the above-identified patent and that said Letters Patent is hereby corrected as shown below:

Column 2, Line 58: Insert -- and such separation is the reverse of the separation in the encoder -- after "one"
Column 7, Line 36: Delete "10" and insert -- 110 --
Column 8, Line 15: Delete "si" and insert -- $s_1$ --
Column 11, Line 5: Delete "arc" and insert -- are --

Signed and Sealed this

Twelfth Day of September, 2006

JON W. DUDAS
*Director of the United States Patent and Trademark Office*